US010225072B2

(12) United States Patent
Bou-Sleiman (10) Patent No.: US 10,225,072 B2
(45) Date of Patent: Mar. 5, 2019

(54) DATA RECEIVER CIRCUIT WITH OFFSET EDGE SAMPLERS (71) Applicant: INTEL CORPORATION, Santa Clara, CA (US)

(72) Inventor: Sleiman Bou-Sleiman, Chandler, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/023,656

(22) PCT Filed: Dec. 13, 2013

(86) PCT No.: PCT/US2013/075156
§ 371 (c)(1),
(2) Date: Mar. 21, 2016

(87) PCT Pub. No.: WO2015/088567
PCT Pub. Date: Jun. 18, 2015

(65) Prior Publication Data
US 2016/0211968 A1    Jul. 21, 2016

(51) Int. Cl.
*H03L 7/08* (2006.01)
*H03L 7/14* (2006.01)
(Continued)

(52) U.S. Cl.
CPC ............... *H04L 7/033* (2013.01); *H03L 7/00* (2013.01); *H03L 7/143* (2013.01); *H04L 43/16* (2013.01)

(58) Field of Classification Search
CPC ... H03L 7/00; H03L 7/091; H03L 7/06; H03L 7/08; H03L 7/0807; H03L 7/087;
(Continued)

(56) References Cited

U.S. PATENT DOCUMENTS 8,705,579 B2  4/2014 Anderson et al.
8,929,496 B2  1/2015 Lee et al.
(Continued)

FOREIGN PATENT DOCUMENTS

GB       2504110 A     1/2014
KR    20100088653 A    8/2010
WO   WO2006078845 A2   7/2006

OTHER PUBLICATIONS

International Search Report and Written Opinion dated Sep. 12, 2014 for International Application No. PCT/US2013/075156, 13 pages.
(Continued)

*Primary Examiner* — Sam K Ahn
*Assistant Examiner* — Sarah Hassan
(74) *Attorney, Agent, or Firm* — Schwabe, Williamson & Wyatt, P.C.

(57) ABSTRACT

Methods, apparatuses, and systems are described related a data receiver circuit having a pair of offset edge samplers to sample a data signal, at an edge sampling time between data samples, with respect to different reference levels. A clock-data recovery (CDR) circuit of the receiver circuit may determine an A-count that corresponds to a number of times the signal level of the data signal at the edge sampling time is between the reference levels of the offset edge samples to provide a signal integrity metric for the receiver circuit. The CDR circuit may dynamically update its settings based on the A-count.

17 Claims, 5 Drawing Sheets (51) Int. Cl.
*H04L 7/033* (2006.01)
*H03L 7/00* (2006.01)
*H04L 12/26* (2006.01)

(58) Field of Classification Search
CPC ... H03L 7/0802; H03L 7/0995; H03L 7/0814; H03L 7/1976; H03L 7/141; H03L 7/143; H03L 7/16
USPC .......................................... 375/371; 326/31
See application file for complete search history.

(56) References Cited

U.S. PATENT DOCUMENTS

| | | |
|---|---|---|
| 2004/0120426 A1 | 6/2004 | Dagdeviren et al. |
| 2006/0280272 A1* | 12/2006 | Stojanovic ............ H04L 7/0331 375/355 |
| 2009/0074407 A1 | 3/2009 | Hornbuckle et al. |
| 2009/0086872 A1 | 4/2009 | Liu et al. |
| 2010/0097071 A1* | 4/2010 | Lee .................. G01R 31/3709 324/537 |
| 2010/0289544 A1 | 11/2010 | Lee et al. |
| 2010/0329403 A1 | 12/2010 | Beukema et al. |
| 2012/0154059 A1 | 6/2012 | van der Wel et al. |
| 2012/0235720 A1* | 9/2012 | Jiang .................... H04L 7/0332 327/158 |
| 2012/0257652 A1 | 10/2012 | Malipatil et al. |
| 2012/0269305 A1 | 10/2012 | Hogeboom |

OTHER PUBLICATIONS

Supplementary Search Report dated Aug. 30, 2017 for European Application No. 13899222.7, 9 pages.

* cited by examiner

DATA RECEIVER CIRCUIT WITH OFFSET EDGE SAMPLERS

CROSS REFERENCE TO RELATED APPLICATIONS

The present application is a national phase entry under 35 U.S.C. § 371 of International Application No. PCT/US2013/075156, filed Dec. 13, 2013, entitled "DATA RECEIVER CIRCUIT WITH OFFSET EDGE SAMPLERS", which designated, among the various States, the United States of America. The Specification of the PCT/US2013/075156 Application is hereby incorporated by reference.

FIELD

Embodiments of the present invention relate generally to electronic circuits and more particularly to a data receiver circuit with offset edge samplers.

BACKGROUND

High-speed input/output (HSIO) receiver systems are used to receive data over a serial communication link. The settings for the HSIO receiver are typically set by the manufacturer of the HSIO receiver and not modified during use. Validation engineers spend considerable time and effort to determine settings for the HSIO receiver that meet certain specifications under multiple use cases. However, the settings may not provide the best performance under all conditions for the HSIO receiver.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Illustrative embodiments of the present disclosure include, but are not limited to, methods, systems, computer-readable media, and apparatuses associated with a data receiver circuit with offset edge samplers. Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific numbers, materials, and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the illustrative embodiments; however, the order of description should not be construed as to imply that these operations are necessarily order dependent. In particular, these operations need not be performed in the order of presentation.

The phrase "in some embodiments" is used repeatedly. The phrase generally does not refer to the same embodiments; however, it may. The terms "comprising," "having," and "including" are synonymous, unless the context dictates otherwise.

The phrase "A and/or B" means (A), (B), or (A and B). The phrases "A/B" and "A or B" mean (A), (B), or (A and B), similar to the phrase "A and/or B."

As used herein, the term "circuitry" refers to, is part of, or includes hardware components such as an Application Specific Integrated Circuit (ASIC), an electronic circuit, a logic circuit, a processor (shared, dedicated, or group) and/or memory (shared, dedicated, or group) that are configured to provide the described functionality. In some embodiments, the circuitry may execute one or more software or firmware programs to provide at least some of the described functionality.

Various embodiments herein provide a data receiver circuit having a pair of offset edge samplers to sample a data signal, at an edge sampling time between data samples, with respect to different reference levels. A clock-data recovery (CDR) circuit of the receiver circuit may determine an A-count that corresponds to a number of times the signal level of the data signal at the edge sampling time is between the reference levels of the offset edge samples. The A-count may provide a signal integrity metric for the receiver circuit. In embodiments, the CDR circuit may dynamically update its settings based on the A-count.

Figure 1:
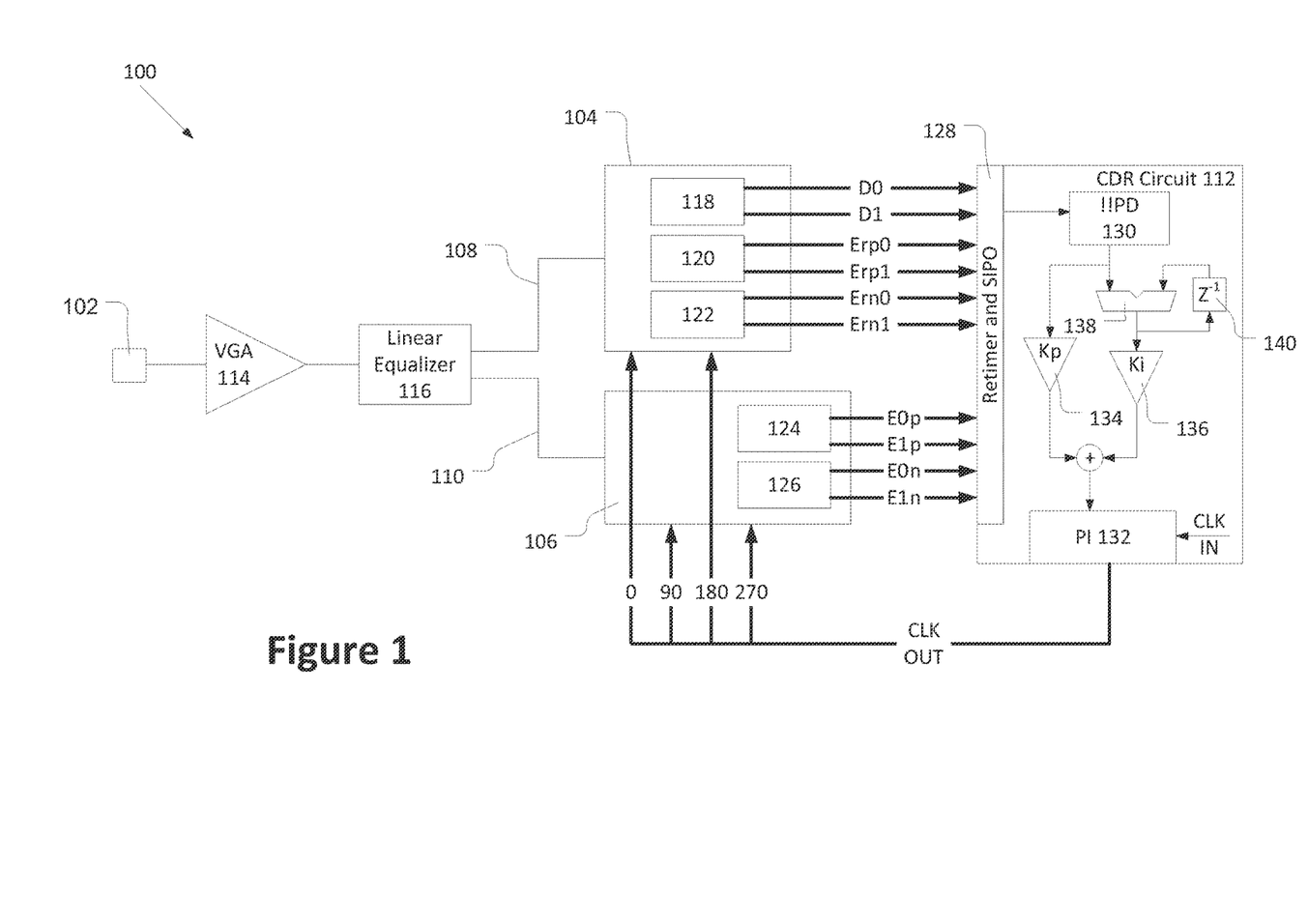
FIG. 1 schematically illustrates a receiver circuit, in accordance with various embodiments.

FIG. 1 schematically illustrates a receiver circuit 100 in accordance with various embodiments. The receiver circuit 100 may be used to receive a data signal, such as a serial data signal. For example, the receiver circuit 100 may be incorporated in a high-speed input/output (HSIO) receiver, such as a Universal Serial Bus (USB), Peripheral Component Interconnect express (PCIe), and/or Serial Advanced Technology Attachment (SATA) receiver, among others.

In various embodiments, the receiver circuit 100 may include an input pad 102 to receive the data signal. The data signal may encode a plurality of data bits according to a signal level (e.g., voltage) of the data signal.

The receiver circuit 100 may further include a data sampler block 104 and an edge sampler block 106 that both receive the data signal. In some embodiments, the data sampler block 104 may receive the data signal via a data path 108 and the edge sampler block may receive the data signal via an edge path 110.

In various embodiments, the receiver circuit 100 may further include a clock-data recovery (CDR) circuit 112 coupled to the data sampler block 104 and the edge sampler block 106. The CDR circuit 112 may produce a clock signal (CLK OUT) and may pass the clock signal to the data sampler block 104 and/or edge sampler block 106 to control operations of the data sampler block and/or edge sampler block, as further discussed below. In some embodiments, the CDR circuit 112 may pass the clock signal to the data sampler block 104 to control operations of the data sampler block 104, and may pass a phase-shifted (e.g., delayed) version of the clock signal to the edge sampler block 106 to control operations of the edge sampler block 104.

In some embodiments, as shown in FIG. 1, the receiver circuit 100 may implement a half-rate receiver in which two bits are encoded in the data signal for each cycle of the clock signal (e.g., one bit per half-cycle of the clock signal). In these embodiments, the CDR circuit 112 may pass the clock signal (e.g., with a zero-degree phase shift), and a version of the clock signal that is phase-shifted by 180 degrees, to the data sampler block 104. The CDR circuit 112 may further pass a version of the clock signal that is phase-shifted by 90 degrees, and a version of the clock signal that is phase-shifted by 270 degrees, to the edge sampler block.

Figure 2:
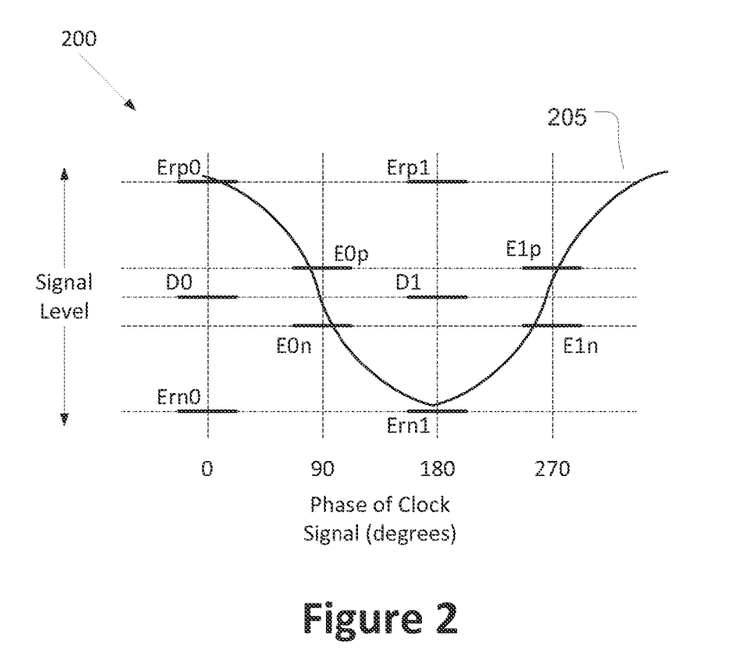
FIG. 2 illustrates a plot showing sampling times and reference levels for respective samplers of the receiver circuit, and an example data signal, in accordance with various embodiments.

FIG. 2 illustrates a plot 200 showing reference levels and sampling times for samplers of the data sampler block 104 and edge sampler block 106, which will be further discussed below. An example data signal 205 is illustrated for reference. The example data signal 205 transitions from a signal level encoding a logic 1 data bit at the zero phase of the clock signal to a signal level encoding a logic 0 data bit at the 180-degree phase of the clock signal. Additionally, the data signal 205 transitions back to a signal level encoding a logic 1 data bit at the 360-degree phase of the clock signal (e.g., the start of the next clock cycle).

In other embodiments, the receiver circuit 100 may implement a full-rate receiver in which the data signal encodes one data bit per clock cycle of the clock signal. In these embodiments, the CDR circuit 112 may pass the clock signal to the data sampler block 104 and may pass a version of the clock signal that is phase-shifted by 180 degrees to the edge sampler block 106.

In some embodiments, the receiver circuit 100 may further include a variable gain amplifier (VGA) 114 and a linear equalizer 116, both of which may be coupled between the input pad 102 and the data sampler block 104 and edge sampler block 106. The VGA 114 and linear equalizer 116 may process the data signal before passing the data signal to the data sampler block 104 and edge sampler block 106. For example, the VGA 114 may amplify the data signal and pass the amplified data signal to the linear equalizer 116. The linear equalizer 116 may equalize the data signal and pass the data signal to the data sampler block 104 and edge sampler block 106 (e.g., via the data path 108 and edge path 110, respectively). One or more parameters of the VGA 114 and/or linear equalizer 116 may be adjusted in a feedback loop by the CDR circuit 112, as further discussed below.

In various embodiments, the data sampler block 104 may include a data sampler 118. The data sampler 118 may sample the data signal periodically, responsive to the clock signal, to determine logic values of respective data bits encoded by the data signal. For example, the data sampler 118 may obtain a data sample of the data signal, at a data sampling time, by comparing a signal level (e.g., voltage) of the data signal at the data sampling time to a data threshold. If the signal level of the data signal is above the data threshold at the data sampling time, the data sample may be a first logic value (e.g., a logic 1). If the signal level of the data signal is below the data threshold at the data sampling time, the data sample may be a second logic value (e.g., a logic 0). In some embodiments, the data threshold may be zero Volts.

With reference to FIG. 2, in embodiments in which the receiver circuit 100 implements a half-rate receiver, the data sampler 118 may obtain a first data sample (D0) at a first data sampling time corresponding to a phase of the clock signal of zero degrees, and may obtain a second data sample (D1) at a second data sampling time corresponding to a phase of the clock signal of 180 degrees.

In some embodiments, the data sampler 118 may include different sampler logic to obtain the first and second data samples, respectively.

In embodiments in which the receiver circuit 100 implements a full-rate receiver, the data sampler 118 may obtain a single data sample per clock cycle of the clock signal (e.g., at a sampling time corresponding to a phase of the clock signal of zero degrees).

In some embodiments, the data sampler block 104 may further include a positive error sampler 120 and/or a negative error sampler 122. The positive error sampler 120 may periodically obtain a positive error sample (e.g., Erp0, Erp1) at the data sampling time, and the negative error sampler 122 may periodically obtain a negative error sample (e.g., Ern0, Ern1) at the data sampling time. The positive error sample may have a binary value to indicate if the signal level of the data signal at the data sampling time is higher or lower than a positive data reference level. The negative error sample may have a binary value to indicate if the signal level of the data signal at the data sampling time is higher or lower than a negative data reference level. The positive data reference level may be higher than the data threshold and the negative data reference level may be lower than the data threshold.

In various embodiments, an adaptation circuit (not shown) may perform amplitude training to adjust the settings of the VGA 114 and/or linear equalizer 116 based on the positive error samples and/or negative error samples. For example, the adaptation circuit may adjust the gain of the VGA 114 and/or equalization settings of the linear equalizer 116 so that, for logic 1 bits encoded by the data signal, the positive error sampler 120 produces approximately equal numbers of positive error samples having a first logic value (indicating that the signal level at the data sampling time is above the positive data threshold) and a second logic value (indicating that the signal level at the data sampling time is below the positive data threshold). Similarly, the adaptation circuit may adjust the gain of the VGA 114 and/or equalization settings of the linear equalizer 116 so that, for logic 0 bits encoded by the data signal, the negative error sampler 122 produces approximately equal numbers of negative error samples having the first logic value and the second logic value.

In various embodiments, the edge sampler block 106 may include a positive edge sampler 124 and a negative edge sampler 126. The positive edge sampler 124 and negative edge sampler 126 may periodically obtain respective edge samples (e.g., positive edge samples and negative edge samples, respectively) of the data signal at a same time point between samples by the data sampler 118. For example, in embodiments in which the receiver circuit 100 implements a half-rate receiver, at a first edge sampling time, corresponding to a phase of the clock signal of 90 degrees, the positive edge sampler 124 may obtain a first positive edge sample (E0p) and the negative edge sampler 126 may obtain a second negative edge sample (E0n). At a second edge sampling time, corresponding to a phase of the clock signal of 270 degrees, the positive edge sampler 124 may obtain a second positive edge sample (E1p) and the negative edge sampler 126 may obtain a second negative edge sample (E1n).

In embodiments in which the receiver circuit 100 implements a full-rate receiver, the positive edge sampler 124 may obtain a single positive edge sample per clock cycle and the negative edge sampler 126 may obtain a single negative edge sample per clock cycle. The positive edge sampler 124 and negative edge sampler 126 may obtain the respective edge samples at a sampling time corresponding to a phase of the clock signal of 180 degrees.

In various embodiments, the positive edge sample may indicate whether the signal level of the data signal at the edge sampling time is higher or lower than a first reference level. For example, the positive edge sample may be a single bit having a first logic value (e.g., a logic 1) if the signal level of the data signal at the edge sampling time is higher than the first reference level and a second logic value (e.g., a logic 0) if the signal level of the data signal at the edge sampling time is lower than the first reference level.

In various embodiments, the negative edge sample may indicate whether the signal level of the data signal at the edge sampling time is higher or lower than a second reference level that is different (e.g., less than) the first reference level. Accordingly, the first and second reference levels may be offset from one another. In some embodiments, the first reference level may be greater than the data threshold and less than the positive data reference level. Additionally, or alternatively, the second reference level may be less than the data threshold and greater than the negative data reference level.

In various embodiments, the CDR circuit 112 may include a retimer and serial input, parallel output (SIPO) block 128 and a bang-bang phase detector 130. The retimer and SIPO block 128 may queue the samples received from the data sampler block 104 and edge sampler block 106 and pass them to the bang-bang phase detector 130. The CDR circuit 112 may further include a phase interpolator 132 to generate the clock signal CLK OUT that is passed to the data sampler block 104. The phase interpolator 132 may receive an input clock signal CLK IN (e.g., from a voltage-controlled oscillator (not shown)) and may generate the clock signal CLK OUT from the input clock signal CLK IN.

The CDR circuit 112 may further include a proportional gain (Kp) amplifier 134, an integral gain (Ki) amplifier 136, an adder 138, and/or a delay element 140. The Kp amplifier 134, Ki amplifier 136, adder 138, and delay element 140 may form a loop filter of the CDR circuit 112. The bang-bang phase detector 130 may control the phase interpolator 132 via the loop filter.

In various embodiments, the CDR circuit 112 may adjust one or more characteristics (e.g., the phase and/or frequency) of the clock signal CLK OUT based on the positive and negative edge samples. For example, the bang-bang phase detector 130 may output an early/late signal. The loop filter may process the early/late signal and generate an output signal based on the early/late signal to control the phase interpolator 132. In some embodiments, the CDR circuit 112 may change the frequency of the clock signal CLK OUT by continuously changing the phase of the clock signal via the phase interpolator 132.

In some embodiments, the CDR circuit 112 may adjust a Kp setting of the Kp amplifier 134 and/or a Ki setting of the Ki amplifier 136 based on the positive and negative edge samples. The Kp and/or Ki settings may change how the clock signal is altered in response to the early/late signal of the bang-bang phase detector 130.

In some embodiments, the CDR circuit 112 may determine an A-count, based on the positive and negative edge samples, that corresponds to a number of times the signal level of the data signal is between the first and second reference levels at the edge sampling time. The A-count may correspond to a number of transitions of the data signal (during which the data signal switches from a logic 0 to a logic 1 or from a logic 1 to a logic 0) that have a signal level at the edge sampling time that is between the first and second reference levels. In some embodiments, the CDR may also determine a B-count that corresponds to a number of transitions of the data signal that have a signal level at the edge sampling time that is above the first reference level or below the second reference level.

For example, Table 1 below is a truth table showing the early/late signal output of the bang-bang phase detector 130 and updates of the A-count and B-count for possible values of the first data sample (D0), second data sample (D1), first positive edge sample (E0p) and first negative edge sample (E0n).

TABLE 1

| D0 | D1 | E0p | E0n | Early/Late Output | A-Count/ B-count |
|----|----|-----|-----|-------------------|------------------|
| 0  | 0  | 0   | 0   | 0                 | Not a transition - |
|    |    | 0   | 1   | 0                 | no updates to    |
|    |    | 1   | 0   | Invalid           | A-count or       |
|    |    | 1   | 1   | Error             | B-count          |
| 0  | 1  | 0   | 0   | Early             | B-count++        |
|    |    | 0   | 1   | 0                 | A-count++        |
|    |    | 1   | 0   | Invalid           | Invalid          |
|    |    | 1   | 1   | Late              | B-count++        |
| 1  | 0  | 0   | 0   | Late              | B-count++        |
|    |    | 0   | 1   | 0                 | A-count++        |
|    |    | 1   | 0   | Invalid           | Invalid          |
|    |    | 1   | 1   | Early             | B-count++        |
| 1  | 1  | 0   | 0   | Error             | Not a transition - |
|    |    | 0   | 1   | 0                 | no updates to    |
|    |    | 1   | 0   | Invalid           | A-count or       |
|    |    | 1   | 1   | 0                 | B-count          |

In various embodiments, the A-count may provide a proxy measurement for the eye-width of the data channel. For example, a higher A-count may correspond to a wider eye-width of the data channel. Thus, the A-count may provide a signal integrity metric for the receiver circuit 100.

In various embodiments, the CDR circuit 112 may adjust the one or more characteristics of the clock signal based on the A-count, for example to maximize the A-count and/or minimize the B-count. The use of the A-count may provide an improvement over a scheme that utilizes a single (non-offset) edge sampler. With a single edge sampler, the edge sample obtained by the edge sampler indicates only if the signal level of the data signal is higher or lower than the reference level of the edge sampler (which is equal to the data threshold), and the CDR circuit adjusts the clock signal to have equal amounts of edge samples on either side of the reference level. The CDR circuit thus adjusts the clock signal without regard to the magnitude by which the signal level of the data signal is different from the data threshold. In contrast, the A-count obtained by the CDR circuit 112 described herein allows the CDR 112 to adjust the clock signal to minimize the number of transitions of the data signal have a signal level at the edge sampling time that is outside the range defined by the first and second reference levels.

Additionally, the CDR circuit 112 may determine and/or dynamically adjust values of the Kp setting of the Kp amplifier 134 and/or the Ki setting of the Ki amplifier 136 based on the A-count and/or B-count. In contrast, in typical data receivers, the Kp setting and Ki setting are determined in advance for a given data receiver design and set by the manufacturer of the data receiver.

Figure 3:
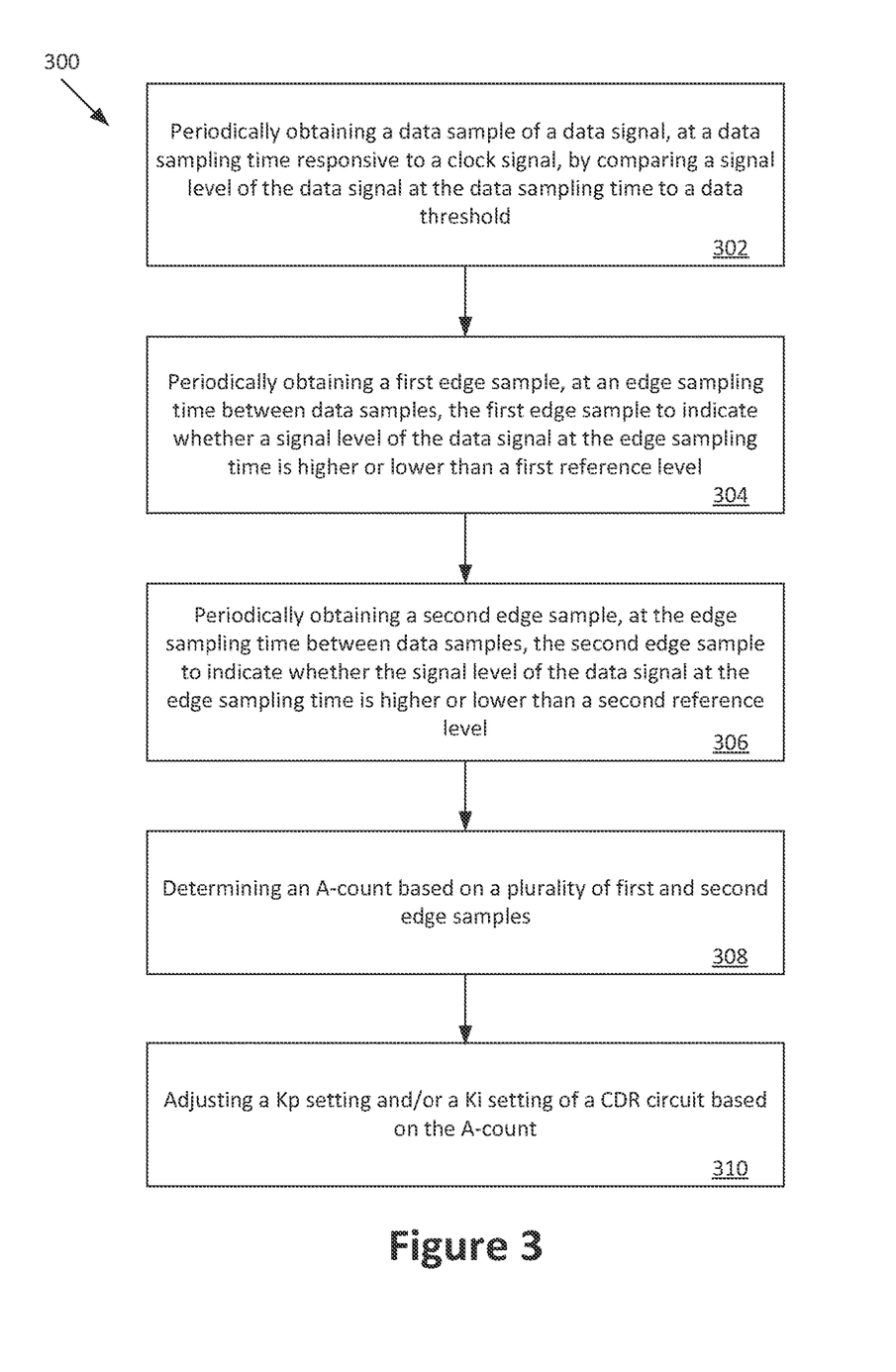
FIG. 3 illustrates a flow chart of a method for receiving data in accordance with various embodiments.

FIG. 3 illustrates a method 300 for receiving data in accordance with various embodiments. The method 300 may be performed by a data receiver such as the receiver circuit 100.

At 302, the method 300 may include periodically obtaining a data sample of a data signal, at a data sampling time responsive to a clock signal. The data sample may indicate whether a signal level of the data signal at the data sampling time is above or below a data threshold (e.g., representing a logic 0 bit or logic 1 bit, respectively).

At 304, the method 300 may include periodically obtaining a first edge sample, at an edge sampling time between data samples. The first edge sample may indicate whether a signal level of the data signal at the edge sampling time is higher or lower than a first reference level. In some embodiments, the first reference level may be higher than the data threshold.

At 306, the method 300 may include periodically obtaining a second edge sample at the edge sampling time. The second edge sample may indicate whether the signal level of the data signal at the edge sampling time is higher or lower than a second reference level. The second reference level may be different from the first reference level. For example, in some embodiments, the second reference level may be lower than the data threshold.

At 308, the method 300 may include determining an A-count, based on a plurality of the first and second edge samples. The A-count may correspond to a number of times the signal level of the data signal is between the first and second reference levels at the edge sampling time.

At 310, the method 300 may include adjusting a Kp setting and/or a Ki setting of a CDR circuit (e.g., CDR circuit 112) based on the A-count. Adjusting the Kp and/or Ki settings of the CDR circuit may alter the rate at which the phase of the clock signal is adjusted.

Figure 4:
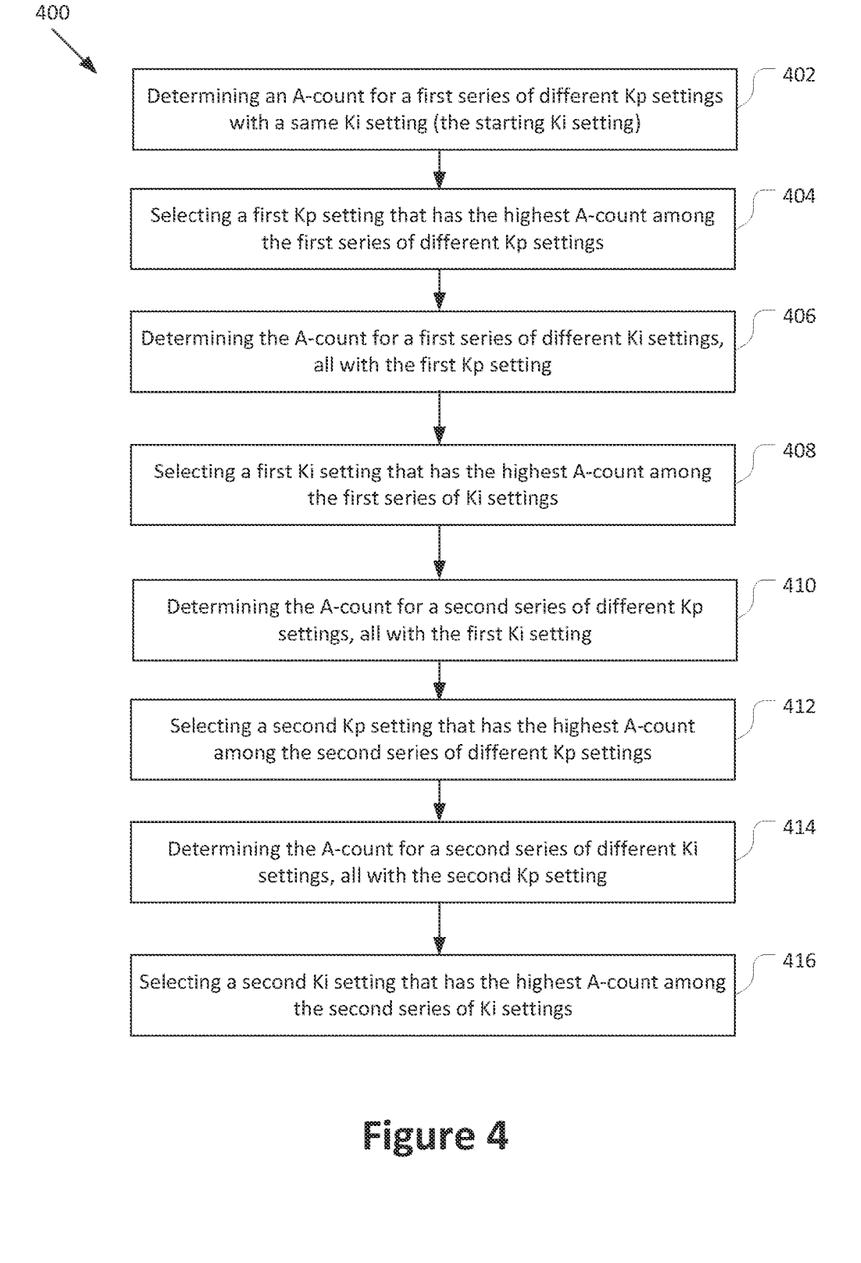
FIG. 4 illustrates a flow chart of a clock-data recovery (CDR) training process in accordance with various embodiments.

In some embodiments, the CDR circuit 112 may determine the values to use for the Kp setting and the Ki setting via a CDR training process. FIG. 4 illustrates a CDR training process 400 in accordance with various embodiments. In some embodiments, the CDR training process 400 may be performed after the amplitude training process described above. Additionally, or alternatively, in some embodiments the settings of the VGA 114 and/or linear equalizer 116 may be kept constant during the CDR training process 400.

At 402, the CDR training process 400 may include determining an A-count associated with the data signal for a first series of different Kp settings of a CDR circuit (e.g., CDR circuit 112) with a same Ki setting. The first series of different Kp settings may start from a starting Kp setting and subsequent Kp settings of the first series of different Kp settings may change from the starting Kp setting. In some embodiments, the starting Kp setting may be the Kp setting that provides the highest proportional gain for the Kp amplifier (e.g., Kp amplifier 134). Additionally, or alternatively, the Ki setting used for the series of different Kp settings (e.g., the starting Ki setting) may be the Ki setting that provides the lowest integral gain for the Ki amplifier (e.g., Ki amplifier 136). The combination of highest proportional gain and lowest integral gain may provide the CDR circuit with the highest bandwidth and stability, which may facilitate maintaining the CDR circuit in a stable operating region during the CDR training process 400.

For example, in some embodiments, the Kp setting and/or Ki settings may be digital settings having an integer value from 1 to n, such as 1 to 16. In these embodiments, the starting Kp setting may be 16, and the starting Ki setting may be 1. The first series of different Kp settings may include Kp settings iterated from the starting Kp setting.

At 404, the CDR training process 400 may include selecting a first Kp setting that has the highest A-count among the series of different Kp settings.

At 406, the CDR training process 400 may include determining the A-count for a first series of different Ki settings of the CDR circuit, all with the first Kp setting. The first series of different Ki settings may start from the starting Ki setting and iterate from the starting Ki setting.

At 408, the CDR training process 400 may include selecting a first Ki setting that has the highest A-count among the series of different Ki settings.

In some embodiments, the CDR training process 400 may further include, at 410, determining the A-count of the data signal for a second series of different Kp settings with the first Ki setting.

At 412, the CDR training process 400 may further include selecting a second Kp setting that has the highest A-count among the second series of different Kp settings. The second Kp setting may be the same as, or different than, the first Kp setting.

At 414, the CDR training process 400 may further include determining the A-count for a second series of different Ki settings of the CDR circuit with the second Kp setting.

At 416, the CDR training process 400 may further include selecting a second Ki setting that has the highest A-count among the second series of different Ki settings.

In some embodiments, the second Kp setting and second Ki setting may be used for normal operation of the CDR circuit. In other embodiments, one or more additional series of Kp settings and/or Ki settings may be obtained and analyzed in a similar manner (e.g., with a third series of Kp settings starting from the second Kp setting and using the second Ki setting).

In various embodiments, the series of different Kp settings and series of different Ki settings may include any suitable number of different settings and may use any suitable step size between iterations. In some embodiments, the first series of Kp settings and/or Ki settings may include a larger step size than the second series of Kp settings and/or Ki settings, respectively. In other embodiments, the first series of Kp settings and/or Ki settings may include the same step size as the second series of Kp settings and/or Ki settings, respectively.

In some embodiments, the CDR training process 400 may be repeated periodically to re-determine the Kp setting and Ki setting to use for operation of the CDR circuit. In some embodiments, the A-count of the data signal may be monitored during operation of the CDR circuit and the CDR training process 400 may be re-initiated if the A-count falls below a threshold. Accordingly, the Kp setting and/or Ki setting may be dynamically updated to respond to changing conditions of the receiver circuit 100.

Referring again to FIGS. 1 and 2, and as discussed above, in some embodiments the first reference level used by the positive edge sampler 124 may be greater than the data threshold, and the second reference level used by the negative edge sampler 126 may be less than the data threshold. In some such embodiments, the edge sampler block 106 may further include a non-offset edge sampler (not shown) to obtain a non-offset edge sample to indicate whether the signal level of the data signal at the edge sampling time is above or below the data threshold. The non-offset edge sample may thus indicate whether the data signal is early or late with respect to the clock signal. In other embodiments, the edge sampler block 106 may not include a non-offset edge sampler. The CDR circuit 112 may still obtain early/late information from the positive edge sampler 124 and negative edge sampler 126, as discussed above and shown in Table 1, when the signal level at the edge sampling time is above the first reference level or below the second reference level.

In other embodiments, the first reference level may be greater than the data threshold and the second reference level may be equal to the data threshold. Thus, the negative edge samples of the negative edge sampler 126 may be used to provide early/late information. In these examples, the B-count may correspond to the number of transitions having a signal level of at the edge sampling time that is above the first reference level of the positive edge sampler, but may not include transitions of the data signal with a signal level at the edge sampling time that is below the second reference level of the negative edge sampler. The CDR circuit 112 may adjust the clock signal based on the A-count and the B-count (e.g., to have a high A-count and a low B-count).

In some embodiments, the CDR circuit 112 may be used with a conventional sampling circuit that has a data sampling block with a data sampler, a positive error sampler, and a negative error sampler, and an edge sampling block with a single edge sampler (e.g., which is conventionally used as a non-offset edge sampler with a reference level equal to the data threshold). In these embodiments, the CDR circuit 112 may adjust the clock signal and the reference levels of the samplers to create a pair of offset edge samplers to practice the embodiments described herein. For example, the CDR circuit 112 may phase-shift the clock signal by 90 degrees to cause the data sampling block to sample the data signal at the edge sampling time (thus converting the data sampling block to an edge sampling block) and to cause the edge sampling block to sample the data signal at the data sampling time (thus converting the edge sampling block to a data sampling block). The reference levels of the positive and negative error samplers may be set to the first and second reference levels, respectively, described herein to convert the positive and negative error samplers to positive and negative error samplers, respectively.

Figure 5:
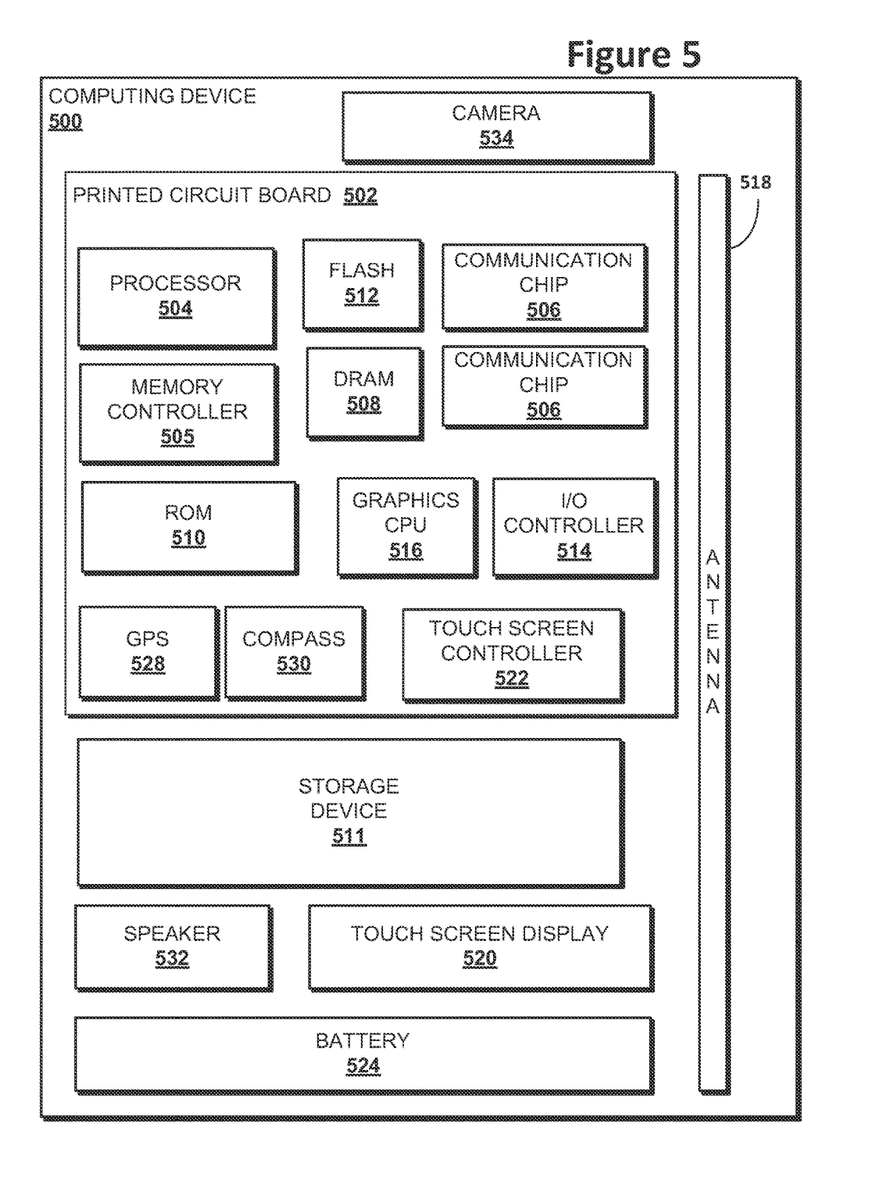
FIG. 5 schematically illustrates an example system that may be used to practice various embodiments described herein.

FIG. 5 illustrates an example computing device 500 which may employ the apparatuses and/or methods described herein (e.g., receiver circuit 100, method 300, CDR process 400), in accordance with various embodiments. As shown, computing device 500 may include a number of components, such as one or more processor(s) 504 (one shown) and at least one communication chip 506. In various embodiments, the one or more processor(s) 504 each may include one or more processor cores. In various embodiments, the at least one communication chip 506 may be physically and electrically coupled to the one or more processor(s) 504. In further implementations, the communication chip 506 may be part of the one or more processor(s) 504. In various embodiments, computing device 500 may include printed circuit board (PCB) 502. For these embodiments, the one or more processor(s) 504 and communication chip 506 may be disposed thereon. In alternate embodiments, the various components may be coupled without the employment of PCB 502.

Depending on its applications, computing device 500 may include other components that may or may not be physically and electrically coupled to the PCB 502. These other components include, but are not limited to, memory controller 505, volatile memory (e.g., DRAM 508), non-volatile memory such as read only memory 510 (ROM), flash memory 512, and storage device 511 (e.g., an HDD), an I/O controller 514, a digital signal processor (not shown), a crypto processor (not shown), a graphics processor 516, one or more antenna 518, a display (not shown), a touch screen display 520, a touch screen controller 522, a battery 524, an audio codec (not shown), a video codec (not shown), a global positioning system (GPS) device 528, a compass 530, an accelerometer (not shown), a gyroscope (not shown), a speaker 532, a camera 534, and a mass storage device (such as hard disk drive, a solid state drive, compact disk (CD), digital versatile disk (DVD))(not shown), and so forth. In various embodiments, the processor 504 may be integrated on the same die with other components to form a System on Chip (SoC).

In some embodiments, the one or more processor(s), flash memory 512, and/or storage device 511 may include associated firmware (not shown) storing programming instructions configured to enable computing device 500, in response to execution of the programming instructions by one or more processor(s) 504, to practice all or selected aspects of the methods described herein (e.g., method 300 and/or CDR process 400). In various embodiments, these aspects may additionally or alternatively be implemented using hardware separate from the one or more processor(s) 504, flash memory 512, or storage device 511.

In various embodiments, one or more components of the computing device 500 may include the receiver circuit 100 described herein for receiving data. For example, the receiver circuit 100 may be included in I/O controller 514, processor 504, memory controller 505, and/or another component of computing device 500. In some embodiments, I/O controller 514 may interface with one or more external devices to receive a data signal using the receiver circuit 100. In other embodiments, the receiver circuit 100 may be used to receive a data signal transferred between two components of the computing device 500.

The communication chips 506 may enable wired and/or wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to IEEE 702.20, General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

In various implementations, the computing device 500 may be a laptop, a netbook, a notebook, an ultrabook, a smartphone, a computing tablet, a personal digital assistant (PDA), an ultra-mobile PC, a mobile phone, a desktop computer, a server, a printer, a scanner, a monitor, a set-top box, an entertainment control unit (e.g., a gaming console or automotive entertainment unit), a digital camera, an appliance, a portable music player, or a digital video recorder. In further implementations, the computing device 500 may be any other electronic device that processes data.

EXAMPLES

Some non-limiting Examples are provided below.

Example 1 is a circuit for receiving data, comprising: a data sampler to sample a data signal periodically, responsive to a clock signal, to determine logic values of respective data bits encoded by the data signal: a first edge sampler to periodically obtain a first edge sample at an edge sampling time between samples by the data sampler, the first edge sample to indicate whether a signal level of the data signal at the edge sampling time is higher or lower than a first reference level; a second edge sampler to periodically obtain a second edge sample at the edge sampling time between samples by the data sampler, the second edge sample to indicate whether the signal level of the data signal at the edge sampling time is higher or lower than a second reference level that is different from the first reference level; and a clock-data recovery (CDR) circuit coupled to the data sampler and the first and second edge samplers, the CDR circuit to adjust one or more characteristics of the clock signal based on the first and second edge samples.

Example 2 is the circuit of Example 1, wherein the CDR circuit is to: determine an A-count, based on the first and second edge samples, that corresponds to a number of times the signal level of the data signal is between the first and second reference levels at the edge sampling time; and adjust the one or more characteristics of the clock signal based on the determined A-count.

Example 3 is the circuit of Example 2, wherein the CDR circuit is to adjust a proportional gain (Kp) setting or an integral gain (Ki) setting of the CDR circuit to adjust a phase of the clock signal.

Example 4 is the circuit of Example 3, wherein the CDR circuit is to adjust the Kp setting and the Ki setting of the CDR circuit by being configured to: determine the A-count of the data signal for a series of different Kp settings of the CDR circuit with a same Ki setting; select a first Kp setting that has the highest A-count among the series of different Kp settings; determine the A-count of the data signal for a series of different Ki settings of the CDR circuit with the first Kp setting; and select a first Ki setting that has the highest A-count among the series of different Ki settings.

Example 5 is the circuit of Example 4, wherein the series of different Kp settings is a first series of different Kp settings, wherein the series of different Ki settings is a first series of different Ki settings, and wherein the CDR circuit is to: determine the A-count of the data signal for a second series of different Kp settings of the CDR circuit with the first Ki setting; select a second Kp setting that has the highest A-count among the second series of different Kp settings; determine the A-count of the data signal for a second series of different Ki settings of the CDR circuit with the second Kp setting; and select a second Ki setting that has the highest A-count among the second series of different Ki settings.

Example 6 is the circuit of Example 1, wherein the clock signal is a first clock signal, and wherein the first and second edge samplers are to obtain the respective first or second edge samples responsive to a second clock signal that is a phase-shifted version of the first clock signal.

Example 7 is the circuit of Example 1, wherein the data sampler, to determine the logic values of the respective data bits, is to periodically compare the signal level of the data signal to a data threshold at a sampling time, and wherein the circuit further comprises: a positive error sampler to determine, at the sampling time, if the signal level of the data signal is higher or lower than a positive data reference level that is higher than the data threshold; and a negative error sampler to determine, at the sampling time, if the signal level of the data signal is higher or lower than a negative data reference level that is lower than the data threshold.

Example 8 is the circuit of Example 7, further comprising: an input pad to receive the data signal; and a variable gain amplifier and a linear equalizer both coupled between the input pad and the data sampler to process the data signal, wherein one or more parameters of the variable gain amplifier and the linear equalizer are determined based on the determinations of the positive and negative error samplers.

Example 9 is the circuit of any one of Examples 1 to 8: wherein the data sampler, to determine the logic values of the respective data bits, is to compare the signal level of the data signal to a data threshold; wherein the first reference level is above the data threshold; and wherein the second reference level is below the data threshold.

Example 10 is the circuit of any one of Examples 1 to 8: wherein the data sampler, to determine the logic values of the respective data bits, is to compare the signal level of the data signal to a data threshold; wherein the first reference level is above the data threshold; and wherein the second reference level is equal to the data threshold.

Example 11 is a method for receiving data, comprising: periodically obtaining a data sample of a data signal, at a data sampling time responsive to a clock signal, the data sample to indicate whether a signal level of the data signal at the data sampling time is above or below a data threshold; periodically obtaining a first edge sample, at an edge sampling time between data samples, the first edge sample to indicate whether a signal level of the data signal at the edge sampling time is higher or lower than a first reference level; periodically obtaining a second edge sample, at the edge sampling time between data samples, the second edge sample to indicate whether the signal level of the data signal at the edge sampling time is higher or lower than a second reference level; and adjusting a phase of the clock signal based on the first and second edge samples.

Example 12 is the method of Example 11, further comprising: determining an A-count, based on the first and second edge samples, that corresponds to a number of times the signal level of the data signal is between the first and second reference levels at the edge sampling time; and adjusting the phase of the clock signal based on the determined A-count.

Example 13 is the method of Example 12, further comprising adjusting a proportional gain (Kp) setting or an integral gain (Ki) setting of a clock-data recovery (CDR) circuit to adjust the phase of the clock signal.

Example 14 is the method of Example 13, wherein the adjusting the Kp setting or the Ki setting includes: determining the A-count of the data signal for a series of different Kp settings of the CDR with a same Ki setting; selecting a first Kp setting that has the highest A-count among the series of different Kp settings; determining the A-count of the data signal for a series of different Ki settings of the CDR with the first Kp setting; and selecting a first Ki setting that has the highest A-count among the series of different Ki settings.

Example 15 is the method of Example 14, wherein the series of different Kp settings is a first series of different Kp settings, wherein the series of different Ki settings is a first series of different Ki settings, and wherein the adjusting the Kp setting or the Ki setting further includes: determining the A-count of the data signal for a second series of different Kp settings of the CDR circuit with the first Ki setting; selecting a second Kp setting that has the highest A-count among the second series of different Kp settings; determining the A-count of the data signal for a second series of different Ki settings of the CDR circuit with the second Kp setting; and selecting a second Ki setting that has the highest A-count among the second series of different Ki settings.

Example 16 is the method of Example 13, wherein the Kp setting or Ki setting are adjusted using a calibration process, and wherein the method further comprises: monitoring the A-count of the data signal over time; and re-initiating the calibration process if the A-count of the data signal falls below an A-count threshold.

Example 17 is the method of any one of Examples 11 to 16, wherein the first reference level is above the data threshold, and the second reference level is below the data threshold.

Example 18 is the method of any one of Examples 11 to 16, wherein the first reference level is above the data threshold, and the second reference level is equal to the data threshold.

Example 19 is a system for receiving data, comprising: a processor; and a receiver circuit coupled to the processor to receive a data signal. The receiver circuit includes: a data sampler to compare a signal level of the data signal to a data threshold, at a data sampling time responsive to a clock signal, to determine logic values of respective data bits encoded by the data signal; a first edge sampler to periodically obtain a first edge sample at an edge sampling time between successive comparisons by the data sampler, wherein the first edge sample indicates if the signal level of the data signal at the edge sampling time is higher or lower than a first reference level; a second edge sampler to periodically obtain a second edge sample at the edge sampling time between successive comparisons by the data sampler, wherein the second edge sample indicates if the signal level of the data signal at the edge sampling time is higher or lower than a second reference level that is different from the first reference level; and a clock-data recovery (CDR) circuit coupled to the data sampler and the first and second edge samplers. The CDR circuit is to: determine an A-count, based on the first and second edge samples, that corresponds to a number of times the signal level of the data signal is between the first and second reference levels at the edge sampling time; and adjust a phase of the clock signal based on the A-count.

Example 20 is the system of Example 19, wherein the CDR circuit is to adjust a proportional gain (Kp) setting and an integral gain (Ki) setting of the CDR circuit to adjust the phase of the clock signal.

Example 21 is the system of Example 20, wherein the CDR circuit is to adjust the Kp setting and the Ki setting of the CDR circuit by being configured to: determine the A-count of the data signal for a series of different Kp settings of the CDR circuit with a same Ki setting; select a first Kp setting that has the highest A-count among the series of different Kp settings; determine the A-count of the data signal for a series of different Ki settings of the CDR circuit with the first Kp setting; and select a first Ki setting that has the highest A-count among the series of different Ki settings.

Example 22 is the system of Example 21, wherein the series of different Kp settings is a first series of different Kp settings, wherein the series of different Ki settings is a first series of different Ki settings, and wherein the CDR circuit is to: determine the A-count of the data signal for a second series of different Kp settings of the CDR circuit with the first Ki setting; select a second Kp setting that has the highest A-count among the second series of different Kp settings; determine the A-count of the data signal for a second series of different Ki settings of the CDR circuit with the second Kp setting; and select a second Ki setting that has the highest A-count among the second series of different Ki settings.

Example 23 is the system of Example 19, wherein the first and second edge samplers are to obtain the respective first or second edge samples responsive to a phase-shifted version of the clock signal.

Example 24 is the system of Example 19, wherein the receiver circuit further comprises: a positive error sampler to determine, at the sampling time of the data sampler, if the signal level of the data signal is higher or lower than a positive data reference level that is higher than the data threshold; and a negative error sampler to determine, at the sampling time of the data sampler, if the signal level of the data signal is higher or lower than a negative data reference level that is lower than the data threshold.

Example 25 is the system of Example 19, wherein the first reference level is above the data threshold and the second reference level is below the data threshold.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. A circuit comprising: a data sampler to sample a data signal periodically, responsive to a clock signal, to determine logic values of respective data bits encoded by the data signal; a first edge sampler to periodically obtain a first edge sample at an edge sampling time between samples by the data sampler, the first edge sample to indicate whether a signal level of the data signal at the edge sampling time is higher or lower than a first reference level; a second edge sampler to periodically obtain a second edge sample at the edge sampling time between samples by the data sampler, the second edge sample to indicate whether the signal level of the data signal at the edge sampling time is higher or lower than a second reference level that is different from the first reference level; and a clock-data recovery (CDR) circuit coupled to the data sampler and the first and second edge samplers, the CDR circuit to adjust one or more characteristics of the clock signal based on the first and second edge samples; wherein the CDR circuit is to: determine an A-count, based on the first and second edge samples, that corresponds to a number of times the signal level of the data signal is between the first and second reference levels at the edge sampling time; and adjust the one or more characteristics of the clock signal based on the determined A- count; wherein the CDR circuit is to: determine an A-count, based on the first and second edge samples, that corresponds to a number of times the signal level of the data signal is between the first and second reference levels at the edge sampling time; and adjust the one or more characteristics of the clock signal based on the determined A- count; wherein the CDR circuit is to: determine an A-count, based on the first and second edge samples, that corresponds to a number of times the signal level of the data signal is between the first and second reference levels at the edge sampling time; and adjust the one or more characteristics of the clock signal based on the determined A-count.

2. The circuit of claim 1, wherein the series of different Kp settings is a first series of different Kp settings, wherein the series of different Ki settings is a first series of different Ki settings, and wherein the CDR circuit is to: determine the A-count of the data signal for a second series of different Kp settings of the CDR circuit with the first Ki setting; select a second Kp setting that has the highest A-count among the second series of different Kp settings; determine the A-count of the data signal for a second series of different Ki settings of the CDR circuit with the second Kp setting; and select a second Ki setting that has the highest A-count among the second series of different Ki settings.

3. The circuit of claim 1, wherein the clock signal is a first clock signal, and wherein the first and second edge samplers are to obtain the respective first or second edge samples responsive to a second clock signal that is a phase-shifted version of the first clock signal.

4. The circuit of claim 1, wherein the data sampler, to determine the logic values of the respective data bits, is to periodically compare the signal level of the data signal to a data threshold at a sampling time, and wherein the circuit further comprises:
a positive error sampler to determine, at the sampling time, if the signal level of the data signal is higher or lower than a positive data reference level that is higher than the data threshold; and
a negative error sampler to determine, at the sampling time, if the signal level of the data signal is higher or lower than a negative data reference level that is lower than the data threshold.

5. The circuit of claim 4, further comprising:
an input pad to receive the data signal; and
a variable gain amplifier and a linear equalizer both coupled between the input pad and the data sampler to process the data signal, wherein one or more parameters of the variable gain amplifier and the linear equalizer are determined based on the determinations of the positive and negative error samplers.

6. The circuit of claim 1:
wherein the data sampler, to determine the logic values of the respective data bits, is to compare the signal level of the data signal to a data threshold;
wherein the first reference level is above the data threshold; and
wherein the second reference level is below the data threshold.

7. The circuit of claim 1:
wherein the data sampler, to determine the logic values of the respective data bits, is to compare the signal level of the data signal to a data threshold;
wherein the first reference level is above the data threshold; and
wherein the second reference level is equal to the data threshold.

8. A method comprising:
periodically obtaining a data sample of a data signal, at a data sampling time responsive to a clock signal, the data sample to indicate whether a signal level of the data signal at the data sampling time is above or below a data threshold; periodically obtaining a first edge sample, at an edge sampling time between data samples, the first edge sample to indicate whether a signal level of the data signal at the edge sampling time is higher or lower than a first reference level; periodically obtaining a second edge sample, at the edge sampling time between data samples, the second edge sample to indicate whether the signal level of the data signal at the edge sampling time is higher or lower than a second reference level; and adjusting a phase of the clock signal based on the first and second edge samples, determining an A-count, based on the first and second edge samples, that corresponds to a number of times the signal level of the data signal is between the first and second reference levels at the edge sampling time; and adjusting the phase of the clock signal based on the determined A-count;
adjusting a proportional gain (Kp) setting or an integral gain (Ki) setting of a clock-data recovery (CDR) circuit to adjust the phase of the clock signal;
wherein the adjusting the Kp setting or the Ki setting includes: determining the A-count of the data signal for a series of different Kp settings of the CDR with a same Ki setting; selecting a first Kp setting that has the highest A-count among the series of different Kp settings; determining the A-count of the data signal for a series of different Ki settings of the CDR with the first Kp setting; and selecting a first Ki setting that has the highest A-count among the series of different Ki settings.

9. The method of claim 8, wherein the series of different Kp settings is a first series of different Kp settings, wherein the series of different Ki settings is a first series of different Ki settings, and wherein the adjusting the Kp setting or the Ki setting further includes: determining the A-count of the data signal for a second series of different Kp settings of the CDR circuit with the first Ki setting; selecting a second Kp setting that has the highest A-count among the second series of different Kp settings; determining the A-count of the data signal for a second series of different Ki settings of the CDR circuit with the second Kp setting; and selecting a second Ki setting that has the highest A-count among the second series of different Ki settings.

10. The method of claim 8, wherein the Kp setting or Ki setting are adjusted using a calibration process, and wherein the method further comprises: monitoring the A-count of the data signal over time; and re-initiating the calibration process if the A-count of the data signal falls below an A-count threshold.

11. The method of claim 8, wherein the first reference level is above the data threshold, and the second reference level is below the data threshold.

12. The method of claim 8, wherein the first reference level is above the data threshold, and the second reference level is equal to the data threshold.

13. A system comprising: a processor; and a receiver circuit coupled to the processor to receive a data signal, the receiver circuit including: a data sampler to compare a signal level of the data signal to a data threshold, at a data sampling time responsive to a clock signal, to determine logic values of respective data bits encoded by the data signal; a first edge sampler to periodically obtain a first edge sample at an edge sampling time between successive comparisons by the data sampler, wherein the first edge sample indicates if the signal level of the data signal at the edge sampling time is higher or lower than a first reference level; a second edge sampler to periodically obtain a second edge sample at the edge sampling time between successive comparisons by the data sampler, wherein the second edge sample indicates if the signal level of the data signal at the edge sampling time is higher or lower than a second reference level that is different from the first reference level; and a clock-data recovery (CDR) circuit coupled to the data sampler and the first and second edge samplers, the CDR circuit to: determine an A-count, based on the first and second edge samples, that corresponds to a number of times the signal level of the data signal is between the first and second reference levels at the edge sampling time; and adjust a phase of the clock signal based on the A-count; wherein the CDR circuit is to adjust a proportional gain (Kp) setting and an integral gain (Ki) setting of the CDR circuit to adjust the phase of the clock signal; wherein the CDR circuit is to adjust the Kp setting and the Ki setting of the CDR circuit by being configured to: determine the A-count of the data signal for a series of different Kp settings of the CDR circuit with a same Ki setting; select a first Kp setting that has the highest A-count among the series of different Kp settings; determine the A-count of the data signal for a series of different Ki settings of the CDR circuit with the first Kp setting; and select a first Ki setting that has the highest A-count among the series of different Ki settings.

14. The system of claim 13, wherein the series of different Kp settings is a first series of different Kp settings, wherein the series of different Ki settings is a first series of different Ki settings, and wherein the CDR circuit is to: determine the A-count of the data signal for a second series of different Kp settings of the CDR circuit with the first Ki setting; select a second Kp setting that has the highest A-count among the second series of different Kp settings; determine the A-count of the data signal for a second series of different Ki settings of the CDR circuit with the second Kp setting; and select a second Ki setting that has the highest A-count among the second series of different Ki settings.

15. The system of claim 13, wherein the first and second edge samplers are to obtain the respective first or second edge samples responsive to a phase-shifted version of the clock signal.

16. The system of claim 13, wherein the receiver circuit further comprises:
 a positive error sampler to determine, at the sampling time of the data sampler, if the signal level of the data signal is higher or lower than a positive data reference level that is higher than the data threshold; and
 a negative error sampler to determine, at the sampling time of the data sampler, if the signal level of the data signal is higher or lower than a negative data reference level that is lower than the data threshold.

17. The system of claim 13, wherein the first reference level is above the data threshold and the second reference level is below the data threshold.

* * * * *